(12) United States Patent
Yamazaki et al.

(10) Patent No.: US 7,629,105 B2
(45) Date of Patent: Dec. 8, 2009

(54) POSITIVE PHOTORESIST COMPOSITION AND METHOD OF FORMING RESIST PATTERN

(75) Inventors: Akiyoshi Yamazaki, Kawasaki (JP); Kazuo Tani, Kawasaki (JP); Naoto Motoike, Kawasaki (JP); Satoshi Maemori, Kawasaki (JP); Sachiko Yoshizawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 399 days.

(21) Appl. No.: 10/566,425

(22) PCT Filed: Sep. 17, 2004

(86) PCT No.: PCT/JP2004/013633

§ 371 (c)(1),
(2), (4) Date: Jan. 30, 2006

(87) PCT Pub. No.: WO2005/026842

PCT Pub. Date: Mar. 24, 2005

(65) Prior Publication Data

US 2006/0210916 A1 Sep. 21, 2006

(30) Foreign Application Priority Data

Sep. 18, 2003 (JP) .............................. 2003-326146
Sep. 24, 2003 (JP) .............................. 2003-331606
Apr. 14, 2004 (JP) .............................. 2004-119494

(51) Int. Cl.
G03F 7/004 (2006.01)
G03F 7/30 (2006.01)

(52) U.S. Cl. .................... 430/270.1; 430/326; 430/330; 430/905; 430/910

(58) Field of Classification Search ................. 430/170, 430/270.1, 905, 910, 326, 330

See application file for complete search history.

(56) References Cited

U.S. PATENT DOCUMENTS

| 5,216,135 | A | 6/1993 | Urano et al. |
| 5,856,561 | A | 1/1999 | Nagata et al. |
| 5,942,367 | A | 8/1999 | Watanabe et al. |
| 6,048,661 | A | 4/2000 | Nishi et al. |
| 6,084,661 | A | 7/2000 | Mendelson et al. |
| 6,358,666 | B1 | 3/2002 | Seo et al. |
| 6,368,980 | B1 | 4/2002 | Minami et al. |
| 6,410,204 | B1 | 6/2002 | Kodama et al. |
| 6,420,082 | B1 | 7/2002 | Sato et al. |
| 6,458,506 | B2 | 10/2002 | Cameron |
| 6,479,211 | B1 | 11/2002 | Sato et al. |
| 6,485,895 | B1 | 11/2002 | Choi et al. |
| 6,492,086 | B1 | 12/2002 | Barclay et al. |
| 6,511,794 | B1 | 1/2003 | Furukawa |
| 6,544,715 | B2 | 4/2003 | Sato et al. |
| 6,627,381 | B1 * | 9/2003 | Uetani et al. .............. 430/270.1 |
| 6,667,415 | B1 | 12/2003 | Yagihashi et al. |
| 6,723,483 | B1 | 4/2004 | Oono et al. |
| 7,402,372 | B2 * | 7/2008 | Hagihara et al. ......... 430/270.1 |
| 2002/0025495 | A1 | 2/2002 | Ogata et al. |
| 2002/0164540 | A1 * | 11/2002 | Nakanishi et al. ........ 430/270.1 |
| 2003/0113661 | A1 | 6/2003 | Uetani et al. |
| 2006/0251986 | A1 * | 11/2006 | Sato et al. ................ 430/270.1 |
| 2007/0042288 | A1 | 2/2007 | Hojo et al. |

FOREIGN PATENT DOCUMENTS

| EP | 1099983 A1 | 5/2001 |
| EP | 1400853 A1 | 3/2004 |
| JP | 04-211258 A | 8/1992 |
| JP | 07285918 | 10/1995 |
| JP | 08193052 | 7/1996 |
| JP | 08193054 | 7/1996 |
| JP | 08193055 | 7/1996 |
| JP | 08245515 | 9/1996 |
| JP | 11-119443 A | 4/1999 |
| JP | 2000-086584 A | 3/2000 |
| JP | 2000-188250 A | 7/2000 |

(Continued)

OTHER PUBLICATIONS

Office Action issued on May 27, 2008, on the counterpart Japanese Application No. 2003-326146.
Office Action issued on May 27, 2008, on the counterpart Japanese Application No. 2004-119494.

Primary Examiner—John S Chu
(74) Attorney, Agent, or Firm—Knobbe, Martens, Olson & Bear, LLP

(57) ABSTRACT

A positive resist composition that includes a resin component (A), which contains acid dissociable, dissolution inhibiting groups and exhibits increased alkali solubility under the action of acid, and an acid generator component (B) that generates acid on exposure, wherein the resin component (A) is a copolymer (A1) containing a first structural unit (a1) derived from hydroxystyrene and a second structural unit (a2) derived from a (meth)acrylate ester having an alcoholic hydroxyl group, in which a portion of the hydroxyl groups of the structural units (a1) and the alcoholic hydroxyl groups of the structural units (a2) have been protected with the acid dissociable, dissolution inhibiting groups; and either the acid generator component (B) includes a diazomethane-based acid generator and an onium salt-based acid generator; or the composition further contains a compound, which contains at least one acid dissociable, dissolution inhibiting group, and generates an organic carboxylic acid under the action of acid generated from the component (B).

13 Claims, No Drawings

FOREIGN PATENT DOCUMENTS

| | | |
|---|---|---|
| JP | 2000-356850 | 12/2000 |
| JP | 2001-228633 A | 8/2001 |
| JP | 2001-272781 A | 10/2001 |
| JP | 2004-333548 | 11/2004 |
| TW | 434458 | 5/2001 |
| TW | 499627 | 8/2002 |
| TW | 520464 | 2/2003 |
| WO | WO 2004/059392 A1 | 7/2004 |

\* cited by examiner

POSITIVE PHOTORESIST COMPOSITION AND METHOD OF FORMING RESIST PATTERN

CROSS-REFERENCE TO RELATED APPLICATIONS

This application is the U.S. National Phase filing under 35 U.S.C. §371 of PCT/JP2004/013633, filed Sep. 17, 2004, which designated the United States, which claims priority to Japanese Patent Application Nos. 2003-326146, filed Sep. 18, 2003, 2003-331606, filed Sep. 24, 2003, and 2004-119494, filed Apr. 14, 2004. The contents of these applications incorporated herein by reference in their entireties.

TECHNICAL FIELD

The present invention relates to a positive resist composition and a method of forming a resist pattern. Priority is claimed on Japanese Patent Application No. 2003-326146, filed Sep. 18, 2003, Japanese Patent Application No. 2003-331606, filed Sep. 24, 2003, and Japanese Patent Application No. 2004-119494, filed Apr. 14, 2004, the contents of which are incorporated herein by reference.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Until recently, ultraviolet radiation such as g-lines and i-lines have been used as the exposure light source, but recently, KrF excimer lasers (248 nm) have been introduced, and even ArF excimer lasers (193 nm) are now starting to be used.

One example of a resist material that satisfies the high resolution conditions required to enable reproduction of a pattern of minute dimensions is a chemically amplified resist composition, which includes a base resin that undergoes a change in alkali solubility under the action of acid, and an acid generator that generates acid on exposure, dissolved in an organic solvent.

Chemically amplified positive resist compositions that have been proposed as ideal resist materials for methods in which exposure is conducted using a KrF excimer laser typically employ a polyhydroxystyrene-based resin, in which a portion of the hydroxyl groups have been protected with acid dissociable, dissolution inhibiting groups, as the base resin (see, for example, Japanese Unexamined Patent Application, First Publication No. Hei 4-211258).

Examples of the most commonly used acid dissociable, dissolution inhibiting groups include so-called acetal groups, including chain-like ether groups typified by 1-ethoxyethyl groups, and cyclic ether groups typified by tetrahydropyranyl groups, as well as tertiary alkyl groups typified by tert-butyl groups, and tertiary alkoxycarbonyl groups typified by tert-butoxycarbonyl groups.

On the other hand, in addition to the research being conducted on resist materials to enable ultra-miniaturization, research and development is also being conducted on pattern formation methods, to develop techniques capable of overcoming the resolution limits of resist materials.

An example of one such miniaturization technique that has been recently proposed is the thermal flow process, wherein a resist pattern is formed using normal lithography techniques, and the resist pattern is then subjected to heat treatment to reduce the pattern size (see, for example, Japanese Unexamined Patent Applications, First Publication Nos. 2000-188250 and 2000-356850).

Thermal flow is a method in which following formation of a resist pattern using photolithography techniques, the resist pattern is heated and softened, causing the pattern to flow towards the gaps in the pattern, thus reducing the resist pattern size, that is, the size of the portions where the resist is not formed (such as the hole diameter in a hole pattern, or the space width in a line and space (L&S) pattern).

In recent years, with the rate of miniaturization accelerating, further improvements in the resolution of resist materials are now being demanded.

However, the conventional polyhydroxystyrene-based resins described above can no longer be claimed to offer adequate resolution. Furthermore, in terms of the cross-sectional shape of the resist pattern, the degree of rectangularity is also inferior, with problems including poor verticalness of the resist pattern side walls, and rounding of the shape at the top portions of resist patterns such as line and space (L&S) patterns. These problems of rectangularity become particularly significant in thermal flow processes, where the resist pattern is heated and caused to flow following developing.

Furthermore, having investigated improvements in resolution using a wide variety of different materials, the inventors of the present invention made the following discovery. Namely, in those cases where a copolymer containing structural units derived from hydroxystyrene and structural units derived from a (meth)acrylate ester having an alcoholic hydroxyl group, wherein a portion of the hydroxyl groups have been protected with acid dissociable, dissolution inhibiting groups, is used as the resin component of a resist material, raising the protection ratio provided by the acid dissociable, dissolution inhibiting groups improves the resolution. However, raising this protection ratio tends to increase the occurrence of developing defects such as developing residues. The occurrence of developing defects is a disadvantage that can become a significant problem in the production of semiconductor elements.

DISCLOSURE OF INVENTION

Accordingly, an object of the present invention is to provide a positive resist composition capable of producing a resist pattern with excellent resolution and favorable rectangularity, a positive resist composition that is resistant to the development of developing defects while retaining excellent resolution, and a method of forming a pattern that uses such positive resist compositions.

A first aspect of the present invention for achieving the above object is a positive resist composition that includes a resin component (A), which contains acid dissociable, dissolution inhibiting groups and exhibits increased alkali solubility under the action of acid, and an acid generator component (B) that generates acid on exposure, wherein the resin component (A) is a copolymer (A1) containing a first structural unit (a1) derived from hydroxystyrene and a second structural unit (a2) derived from a (meth)acrylate ester having an alcoholic hydroxyl group, in which a portion of the hydroxyl groups of the structural units (a1) and the alcoholic hydroxyl groups of the structural units (a2) have been protected with the acid dissociable, dissolution inhibiting groups, and the acid generator component (B) includes a diazomethane-based acid generator and an onium salt-based acid generator.

A second aspect of the present invention for achieving the above object is a positive resist composition that includes a resin component (A), which contains acid dissociable, dissolution inhibiting groups and exhibits increased alkali solubility under the action of acid, and an acid generator component (B) that generates acid on exposure, wherein the resin component (A) is a copolymer (A1) containing a first structural unit (a1) derived from hydroxystyrene and a second structural unit (a2) derived from a (meth)acrylate ester having an alcoholic hydroxyl group, in which a portion of the hydroxyl groups of the structural units (a1) and the alcoholic hydroxyl groups of the structural units (a2) have been protected with the acid dissociable, dissolution inhibiting groups, and the composition further contains a compound (C), which contains at least one acid dissociable, dissolution inhibiting group, and which under the action of the acid generated from the component (B), undergoes dissociation of the dissolution inhibiting group, generating an organic carboxylic acid.

A third aspect of the present invention for achieving the above object is a method of forming a resist pattern that includes the steps of: forming a positive resist film on top of a substrate using an aforementioned positive resist composition, conducting a selective exposure treatment of the positive resist film, and performing alkali developing to form the resist pattern.

A fourth aspect of the present invention is a method of forming a resist pattern that includes the steps of: forming a positive resist film on top of a substrate using a positive resist composition according to the second aspect of the present invention, conducting a selective exposure treatment of the positive resist film, and performing alkali developing to form the resist pattern.

In the present invention, the term "(meth)acrylate" is a generic term that includes both methacrylate and acrylate. The term "structural unit" refers to a monomer unit that contributes to the formation of a polymer.

(Effects of the Invention)

A first aspect of the present invention provides a positive resist composition capable of producing a resist pattern with excellent resolution and favorable rectangularity, and a method of forming a pattern that uses such a positive resist composition.

A second aspect of the present invention provides a positive resist composition that is resistant to the development of developing defects, and particularly developing residues, while retaining excellent resolution, and a method of forming a pattern that uses such a positive resist composition.

BEST MODE FOR CARRYING OUT THE INVENTION

As follows is a more detailed description of the present invention.

<<Positive Resist Composition>>

[Positive Resist Composition Embodiment 1 (Positive Resist Composition of the First Aspect of the Present Invention)]

A positive resist composition of the first aspect of the present invention includes a resin component (A) (hereafter referred to as the component (A)), which contains acid dissociable, dissolution inhibiting groups and exhibits increased alkali solubility under the action of acid, and an acid generator component (B) (hereafter referred to as the component (B)) that generates acid on exposure.

In the component (A), the action of acid generated from the component (B) causes the acid dissociable, dissolution inhibiting groups to dissociate, causing the entire component (A) to change from an alkali-insoluble state to an alkali-soluble state.

As a result, when a resist is exposed through a mask pattern during the formation of a resist pattern, or alternatively, is exposed and then subjected to post exposure baking, the exposed portions of the resist shift to an alkali-soluble state, whereas the unexposed portions remain insoluble in alkali, meaning that alkali developing can then be used to form a positive resist pattern.

<Component (A)>

In the present invention, the component (A) is a copolymer (hereafter referred to as the copolymer (A1)) containing, as essential structural units, a first structural unit (a1) derived from hydroxystyrene and a second structural unit (a2) derived from a (meth)acrylate ester having an alcoholic hydroxyl group, wherein a portion of the hydroxyl groups of the first structural units (a1) and the alcoholic hydroxyl groups of the second structural units (a2) have been protected with acid dissociable, dissolution inhibiting groups.

This copolymer (A1) may also include a third structural unit (a3) derived from styrene in addition to the first structural unit (a1) and the second structural unit (a2).

[First Structural Unit (a1)]

The structural unit (a1) is a structural unit derived from hydroxystyrene, and is represented by a general formula (1) shown below. In other words, in this description, the name hydroxystyrene describes both the literal hydroxystyrene, as well as α-methylhydroxystyrene.

In the structural unit (a1) represented by the general formula (I) shown below, the bonding position of the hydroxyl group may be the o-position, the m-position, or the p-position, although from the viewpoints of availability and cost, the p-position is preferred.

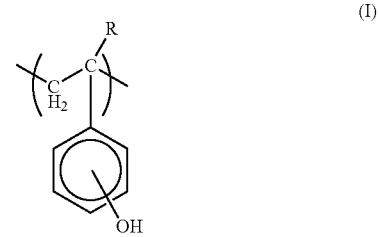

(I)

(wherein, R represents a hydrogen atom or a methyl group)

[Second Structural Unit (a2)]

The structural unit (a2) is a structural unit derived from a (meth)acrylate ester having an alcoholic hydroxyl group.

As a result of the inclusion of the structural unit (a2), the copolymer (A1) has a lower solubility in alkali developing solutions than conventional resins in which a portion of the hydroxyl groups of a polyhydroxystyrene have been protected with acid dissociable, dissolution inhibiting groups (hereafter also referred to as PHS resins).

In other words, in conventional PHS resins, all of the units other than those protected by the acid dissociable, dissolution inhibiting groups are structural units derived from hydroxystyrene (hereafter also referred to as hydroxystyrene units). The hydroxyl group of a hydroxystyrene unit is a phenolic hydroxyl group. In contrast, the copolymer (A1) contains a structural unit (the structural unit (a2)) that is capable of introducing alcoholic hydroxyl groups, which exhibit inferior alkali solubility to phenolic hydroxyl groups, into a portion of the base resin side chains instead of the above hydroxystyrene units. As a result, the solubility of the copolymer (A1) in alkali developing solutions is less than that of PHS resins. This means the protection ratio can be lowered, the level of defects can be reduced, and the resolution can be improved.

Accordingly, provided the structural unit (a2) of the present invention exhibits this action, then there are no particular restrictions on the structural unit, and any structural unit derived from a (meth)acrylate ester having an alcoholic hydroxyl group can be used, although structural units derived from (meth)acrylate esters containing an aliphatic polycyclic group having an alcoholic hydroxyl group exhibit particularly superior resolution and dry etching resistance, and are consequently preferred.

Examples of the polycyclic group that constitutes the aforementioned aliphatic polycyclic group having an alcoholic hydroxyl group include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. These types of polycyclic groups can be appropriately selected from the multitude of groups proposed for use with conventional ArF resists. Of these groups, adamantyl groups, norbornyl groups, and tetracyclododecanyl groups are preferred industrially.

As the structural unit (a2), structural units derived from (meth)acrylate esters containing an adamantyl group having at least one alcoholic hydroxyl group, as represented by a general formula (II) shown below, can be particularly favorably employed.

Of the structural units (a2) represented by the general formula (II) shown below, structural units represented by a general formula (IIa) shown below are the most desirable.

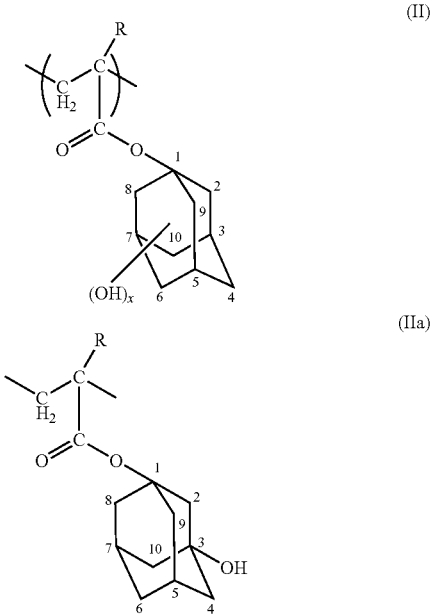

(wherein, R represents a hydrogen atom or a methyl group, and x represents an integer from 1 to 3)

[Acid Dissociable, Dissolution Inhibiting Groups]

In the copolymer (A1), of the hydroxyl groups of the first structural units (a1) and the alcoholic hydroxyl groups of the second structural units (a2), a portion must be protected with acid dissociable, dissolution inhibiting groups.

As the acid dissociable, dissolution inhibiting groups, any of the multitude of acid dissociable, dissolution inhibiting groups proposed for use with conventional chemically amplified KrF positive resist compositions or ArF positive resist compositions can be used, and specific examples include chain-like or cyclic tertiary alkyl groups such as tert-butyl groups, tert-amyl groups, 1-methylcyclopentyl groups, 1-ethylcyclopentyl groups, 1-methylcyclohexyl groups, and 1-ethylcyclohexyl groups, cyclic ether groups such as tetrahydropyranyl groups and tetrahydrofuranyl groups, and 1-lower alkoxyalkyl groups represented by a general formula (III) shown below, in which the 1-position is substituted with a straight-chain, branched, or cyclic alkoxy group of 1 to 8 carbon atoms. Of these groups, 1-lower alkoxyalkyl groups represented by the general formula (III) are particularly preferred. Specific examples of these groups include straight-chain and branched alkoxyalkyl groups such as 1-ethoxyethyl groups and 1-isopropoxyethyl groups, and cyclic alkoxyalkyl groups such as 1-cyclohexyloxyethyl groups, and of these, 1-ethoxyethyl groups are particularly desirable as they provide excellent resolution.

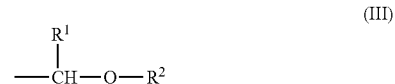

(wherein $R^1$ represents an alkyl group of 1 to 4 carbon atoms, and $R^2$ represents either a straight-chain or branched alkyl group of 1 to 8 carbon atoms, or a cycloalkyl group of 5 to 7 carbon atoms)

In the present invention, the protection ratio for the hydroxyl groups within the copolymer (A1) is preferably within a range from at least 10 mol % to no more than 25 mol %, and preferably from at least 15 mol % to no more than 20 mol %, of the combined total of the hydroxyl groups within the structural units (a1) and the alcoholic hydroxyl groups within the structural units (a2).

Ensuring that the hydroxyl group protection ratio is no greater than the upper limit of the above range enables a favorable rectangularity to be achieved for the resist pattern following developing. Furthermore, pattern defects within the resist pattern following developing (developing defects) can also be effectively prevented. On the other hand, ensuring that the hydroxyl group protection ratio is at least as large as the lower limit of the above range enables a favorable resolution performance to be achieved.

In the copolymer (A1), the hydroxyl groups protected by the acid dissociable, dissolution inhibiting groups may be either the hydroxyl groups of the structural units (a1) or the alcoholic hydroxyl groups of the structural units (a2), and there are no particular restrictions, although copolymers in which either only the hydroxyl groups of the structural units (a1) (the hydroxystyrene phenolic hydroxyl groups) are protected, or copolymers in which both the hydroxyl groups of the structural units (a1) and the alcoholic hydroxyl groups of the second structural unit (a2) are protected by the acid dissociable, dissolution inhibiting groups, are preferred. Furthermore, although dependent on the acid dissociable, dissolution inhibiting groups used, the case in which both the hydroxyl groups of the structural units (a1) and the alcoholic hydroxyl groups of the structural units (a2) are protected by the acid dissociable, dissolution inhibiting groups is usually the most preferred.

In the copolymer (A1), the molar ratio between the copolymer structural units (a1) and the structural units (a2) prior to protection with the acid dissociable, dissolution inhibiting groups is preferably within a range from 85:15 to 70:30, and even more preferably within a range from 82:18 to 78:22.

If the proportion of the structural units (a2) exceeds the above range, then the solubility of the copolymer within the developing solution is inadequate, whereas if the proportion is too small, the effect achieved by using the structural units (a2) does not manifest adequately.

Furthermore, in the copolymer (A1), the combination of the structural units (a1) and the structural units (a2) within the copolymer, prior to protection with the acid dissociable, dissolution inhibiting groups, preferably accounts for at least 90 mol % of all the structural units that constitute the copolymer (A1). If this proportion falls below 90%, the resolution tends to deteriorate. The proportion of the copolymer accounted for by the combination of the structural units (a1) and the structural units (a2) is even more preferably 95 mol % or greater, and may also be 100 mol %.

[Third Structural Unit (a3)]

The structural unit (a3) is a structural unit derived from styrene, and is represented by a general formula (IV) shown below. In other words, in this description, the name styrene refers to both the literal styrene, and α-methylstyrene.

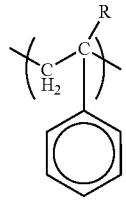

(IV)

(wherein, R represents a hydrogen atom or a methyl group)

In the present invention, the structural unit (a3) is not essential, although including this structural unit provides certain benefits such as improving the depth of focus, and improving the dry etching resistance.

If a third structural unit (a3) is used, then the proportion of the structural units (a3) within the copolymer (A1) is preferably from 0.5 to 10 mol %, and even more preferably from 2 to 5 mol %, of the combination of all the structural units that constitute the copolymer (A1). If the proportion of the structural units (a3) exceeds the above range, then the solubility of the copolymer in the developing solution tends to deteriorate.

In the copolymer (A1), the weight average molecular weight (the polystyrene-equivalent value determined using gel permeation chromatography, this also applies to all subsequent molecular weight values) of the copolymer prior to protection of a portion of the hydroxyl groups with acid dissociable, dissolution inhibiting groups, is preferably at least 2,000 but no more than 8,500, and is even more preferably at least 4,500 but no more than 8,500. Provided this weight average molecular weight is no more than 8,500, the rectangularity of the resist pattern can be improved. Furthermore, the generation of microbridges can also be prevented. Furthermore, provided the weight average molecular weight is at least 2,000, the etching resistance and the heat resistance are favorable.

In this description, the term "microbridge" describes a type of developing defect, where in a line and space pattern, for example, portions of adjacent resist patterns near the surface of the pattern are linked together via a portion of resist, generating a bridge-like defect. Microbridges are increasingly likely for higher weight average molecular weight values, and for higher temperatures within post exposure baking (PEB).

Furthermore, prior to protection of a portion of the hydroxyl groups with acid dissociable, dissolution inhibiting groups, the copolymer is preferably a monodisperse system with a low polydispersity (Mw/Mn ratio), as this provides superior resolution.

Specifically, the polydispersity is typically no more than 2.0, and preferably 1.5 or less.

The copolymer (A1) can be produced, for example, by copolymerizing a monomer corresponding with the structural unit (a1) in which the hydroxyl group is not protected, and a monomer corresponding with the structural unit (a2) in which the hydroxyl group is not protected, using a normal method such as a conventional radical polymerization method that uses a radical polymerization initiator such as azobisisobutyronitrile (AIBN) or azobis(2-methylpropionate), and then using a known technique to protect the hydroxyl groups of the structural units (a1) and/or the structural units (a2) with acid dissociable, dissolution inhibiting groups.

Furthermore, the copolymer (A1) can also be produced by preparing a monomer that corresponds with the structural unit obtained by protecting the hydroxyl group of the structural unit (a1) with an acid dissociable, dissolution inhibiting group, copolymerizing this monomer with a monomer corresponding with the structural unit (a2) using normal methods, and then using hydrolysis to change a portion of the hydroxyl groups that have been protected with acid dissociable, dissolution inhibiting groups back to hydroxyl groups, and where necessary, using normal methods to protect the hydroxyl groups of the structural units (a2) with acid dissociable, dissolution inhibiting groups.

The quantity of the copolymer (A1), namely the component (A), within a positive resist composition of the present invention can be adjusted in accordance with the thickness of the resist film that is to be formed.

<Component (B)>

In the present invention, as the component (B), a combination of at least one diazomethane-based acid generator and at least one onium salt-based acid generator is used. By combining the component (A) described above with this acid generator mixture, a resist pattern that exhibits high resolution and favorable rectangularity can be formed.

As the diazomethane-based PAG, any compound appropriately selected from conventional materials can be used, and of these, compounds such as the bis(hydrocarbonsulfonyl)diazomethanes represented by the general formula (V) shown below are particularly desirable in terms of transparency, appropriate acid strength, and alkali solubility and the like.

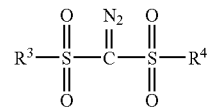

(V)

In the formula (V), $R^3$ and $R^4$ each represent, independently, a branched or cyclic alkyl group or aryl group of 3 to 8 carbon atoms, and preferably 4 to 7 carbon atoms. Specific examples of the groups $R^3$ and $R^4$ include a tert-butyl group, cyclohexyl group, or phenyl group. Of these, a cyclohexyl group yields even better improvement in the rectangularity of the resist pattern and a further improvement in the resolution, and is consequently preferred. It is believed that the reason for this preference is that because the cyclohexyl group is a bulky group, diffusion of the generated acid through the resist is inhibited.

Specific examples of bis(hydrocarbonsulfonyl)diazomethanes include bis(alkylsulfonyl)diazomethanes containing a straight-chain or branched alkyl group of 1 to 4 carbon atoms, such as bis(n-propylsulfonyl)diazomethane, bis(isopropylsulfonyl)diazomethane, bis(n-butylsulfonyl)diazomethane, bis(isobutylsulfonyl)diazomethane, bis(tert-butylsulfonyl)diazomethane, and bis(1,1-dimethylsulfonyl) diazomethane; bis(alkylsulfonyl)diazomethanes containing a cyclic alkyl group of 5 to 6 carbon atoms, such as bis(cyclopentylsulfonyl)diazomethane and bis(cyclohexylsulfonyl) diazomethane; and bis(arylsulfonyl)diazomethanes containing an aryl group, such as bis(p-toluenesulfonyl) diazomethane and bis(2,4-dimethylphenylsulfonyl) diazomethane. Of these, bis(cyclohexylsulfonyl) diazomethane is preferred as it yields a large improvement in rectangularity and enables the formation of a high resolution resist pattern.

These compounds of the component (B) can be used either alone, or in combinations of two or more different compounds.

Specific examples of the onium salt-based acid generator include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these, onium salts with a fluorinated alkylsulfonate ion as the anion are preferred. These onium salt-based acid generators can be used either alone, or in combinations of two or more different materials.

In the component (B), the diazomethane-based acid generator is preferably the principal component. Describing the diazomethane-based acid generator as the principal component means that within the component (B), the blend quantity of the diazomethane-based acid generator is the largest.

In the component (B), the blend quantity of the diazomethane-based acid generator is preferably within a range from 40 to 95% by weight, even more preferably from 50 to 90% by weight, even more preferably from 55 to 90% by weight, and most preferably from 80 to 90% by weight.

On the other hand, the blend quantity of the onium salt-based acid generator within the component (B) is preferably within a range from 5 to 60% by weight, even more preferably from 10 to 50% by weight, even more preferably from 10 to 45% by weight, and most preferably from 10 to 20% by weight.

In the present invention, the component (B) may also include other materials typically used as acid generators in conventional chemically amplified resists, in addition to the diazomethane-based acid generator and the onium salt-based acid generator, although in order to maximize the effects of the present invention, the combination of the diazomethane-based acid generator and the onium salt-based acid generator preferably accounts for at least 80% by weight of the component (B), and may also be 100%.

The quantity used of the component (B) is typically within a range from 1 to 20 parts by weight, and preferably from 2 to 10 parts by weight, per 100 parts by weight of the component (A). If the quantity is lower than the above range, then pattern formation does not progress satisfactorily, whereas if the quantity exceeds the above range, it becomes difficult to achieve a uniform solution, and there is a danger of a deterioration in the storage stability of the composition.

<Nitrogen-Containing Compound (D)>

In a positive resist composition of the present invention, in order to improve the resist pattern shape including the rectangularity, and the post exposure stability of the latent image formed by the pattern-wise exposure of the resist layer, a nitrogen-containing organic compound (D) (hereafter referred to as the component (D)) can be added as an optional component.

A multitude of these organic compounds have already been proposed, and any of these known compounds can be used as the component (D), although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, triisopropylamine, tripentylamine, diethanolamine, and triethanolamine. Of these, tertiary alkanolamines such as triethanolamine are particularly preferred.

These compounds can be used either alone, or in combinations of two or more different compounds.

The component (D) is typically used in a quantity within a range from 0.01 to 5.0% by weight relative to the component (A).

<Cross-Linking Agent (E)>

In those cases where a positive resist composition of the present invention is used within a process that incorporates a thermal flow treatment described below, the positive resist composition of the present invention may also include a cross-linking agent (E) (hereafter referred to as the component (E)).

This component (E) reacts with the component (A) on heating and generates cross-linking. By adding the component (E), the rectangularity of the resist pattern can be further improved when a thermal flow treatment is conducted.

As the component (E), any of the materials already known as suitable cross-linking agents for chemically amplified resist compositions suited to thermal flow treatment can be used.

Specifically, as the component (E), compounds containing at least two cross-linking vinyl ether groups can be used, and examples include compounds in which at least two hydroxyl groups of polyoxyalkylene glycols such as alkylene glycols, dialkylene glycols and trialkylene glycols, or a polyhydric alcohol such as trimethylolpropane, pentaerythritol or pentaglycol have been substituted with vinyl ether groups. One specific example of a preferred component (E) is cyclohexyldimethanol divinyl ether.

The component (E) can be used either alone, or in combinations of two or more different compounds.

If used, the quantity of the component (E) is typically within a range from 0.1 to 25% by weight, and preferably from 1 to 15% by weight, relative to the component (A).

<Other Optional Components>

Other miscible additives can also be added to a positive resist composition of the present invention according to need, and examples include additive resins for improving the properties of the resist film, surfactants for improving the ease of application, dissolution inhibitors, plasticizers, stabilizers, colorants, and halation prevention agents. Of these, the addition of dissolution inhibitors yields additional improvements in the resolution and rectangularity, and is consequently preferred.

<Organic Solvent>

A positive resist composition according to the present invention can be produced by dissolving either the essential components (A) and (B), or the component (A), the component (B), the component (C), and if required the components (D) and (E) and any other optional components, in an organic solvent.

The organic solvent may be any solvent capable of dissolving each of the components used to generate a uniform solution, and one or more solvents selected from known materials used as the solvents for conventional chemically amplified resists can be used.

Examples of the organic solvent include those solvents listed below. Namely, ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent containing two or more different solvents.

In particular, mixed solvents of propylene glycol monomethyl ether acetate (PGMEA), and a polar solvent containing a hydroxyl group or a lactone such as propylene glycol monomethyl ether (PGME), ethyl lactate (EL) or γ-butyrolactone offer improved levels of storage stability for the positive resist composition, and are consequently preferred. In the case of a mixed solvent with EL, the weight ratio PGMEA:EL is preferably within a range from 6:4 to 4:6.

In those cases where PGME is added, the weight ratio of PGMEA:PGME is typically within a range from 8:2 to 2:8, and preferably from 8:2 to 5:5.

There are no particular restrictions on the quantity used of the organic solvent, although typically, a sufficient quantity of the solvent is added to produce a solid fraction concentration of 8 to 25% by weight, and preferably from 10 to 20% by weight.

[Positive Resist Composition Embodiment 2 (Positive Resist Composition of the Second Aspect of the Present Invention)]

An embodiment 2 of the positive resist composition of the present invention includes a resin component (A) (hereafter referred to as the component (A), in the same manner as the positive resist composition embodiment 1), which contains acid dissociable, dissolution inhibiting groups and exhibits increased alkali solubility under the action of acid, an acid generator component (B) (hereafter referred to as the component (B), in the same manner as the positive resist composition embodiment 1) that generates acid on exposure, and a compound (C) (hereafter referred to as the component (C)), which contains at least one acid dissociable, dissolution inhibiting group, and which under the action of the acid generated from the component (B), undergoes dissociation of the dissolution inhibiting group, generating an organic carboxylic acid.

Regarding the component (A), the action of acid generated from the component (B) causes the acid dissociable, dissolution inhibiting groups to dissociate, causing the entire component (A) to change from an alkali-insoluble state to an alkali-soluble state.

As a result, when a resist is exposed through a mask pattern during the formation of a resist pattern, or alternatively, is exposed and then subjected to post exposure baking, the exposed portions of the resist shift to an alkali-soluble state, whereas the unexposed portions remain insoluble in alkali, meaning that alkali developing can then be used to form a positive resist pattern.

The above descriptions for the aforementioned positive resist composition embodiment 1 can also be applied to the component (A), the component (D), the component (E), and the other components and the organic solvent of this embodiment.

<Component (B)>

In the positive resist composition embodiment 2, as the component (B), a compound appropriately selected from known materials used as acid generators in conventional chemically amplified resists can be used.

Of the possible acid generators, diazomethane-based acid generators and onium salt-based acid generators are preferred. Specific examples of these acid generators include the same compounds listed in relation to the aforementioned positive resist composition embodiment 1.

As the component (B), either a single acid generator can be used alone, or a combination of two or more different compounds may also be used.

The quantity used of the component (B) is typically within a range from 1 to 20 parts by weight, and preferably from 2 to 10 parts by weight, per 100 parts by weight of the component (A). If the quantity is lower than the above range, then pattern formation does not progress satisfactorily, whereas if the quantity exceeds the above range, it becomes difficult to achieve a uniform solution, and there is a danger of a deterioration in the storage stability of the composition.

<Component (C)>

By adding the component (C), developing defects, and particularly developing residues, can be suppressed while a favorable level of resolution is retained. As a result, very fine resist patterns can be resolved.

There are no particular restrictions on the component (C), which can use one of the multitude of compounds already proposed, for example in Japanese Unexamined Patent Application, First Publication No. Hei 6-287163, Japanese Unexamined Patent Application, First Publication No. Hei 7-285918, Japanese Unexamined Patent Application, First Publication No. Hei 8-193052, Japanese Unexamined Patent Application, First Publication No. Hei 8-193054, Japanese Unexamined Patent Application, First Publication No. Hei 8-193055, Japanese Unexamined Patent Application, First Publication No. Hei 8-245515, or Japanese Unexamined Patent Application, First Publication No. Hei 9-77720.

The acid dissociable, dissolution inhibiting group may be appropriately selected from those groups already known from conventional chemically amplified positive resists, and these groups can be classified into two main types: groups for those cases in which a phenolic hydroxyl group is protected with the acid dissociable, dissolution inhibiting group, and groups for those cases in which a carboxyl group is protected with the acid dissociable, dissolution inhibiting group.

Specific examples of these types of acid dissociable, dissolution inhibiting groups include tertiary alkyloxycarbonyl groups such as a tert-butyloxycarbonyl group or tert-amyloxycarbonyl group; tertiary alkyloxycarbonylalkyl groups such as a tert-butyloxycarbonylmethyl group or tert-butyloxycarbonylethyl group; tertiary alkyl groups such as a tert-butyl group or tert-amyl group; cyclic ether groups such as a tetrahydropyranyl group or tetrahydrofuranyl group; alkoxyalkyl groups such as an ethoxyethyl group or methoxypropyl group; and 1-alkylcycloalkyl groups, including 1-lower alkyl monocycloalkyl groups such as a 1-methylcyclohexyl group or 1-ethylcyclohexyl group, and 1-lower alkylpolycycloalkyl groups such as a 1-methyladamantyl group or 1-ethyladamantyl group.

Of these groups, a tert-butyloxycarbonyl group, tert-butyloxycarbonylmethyl group, tert-butyl group, tetrahydropyranyl group, ethoxyethyl group, 1-methylcyclohexyl group or 1-ethylcyclohexyl group is preferred.

Examples of suitable acid dissociable, dissolution inhibiting groups for phenolic hydroxyl groups include all the above acid dissociable, dissolution inhibiting groups excluding the 1-alkylcycloalkyl groups. Examples of suitable acid dissociable, dissolution inhibiting groups for carboxyl groups include all the above acid dissociable, dissolution inhibiting groups excluding the tertiary alkyloxycarbonyl groups.

The component (C) must undergo dissociation of the acid dissociable, dissolution inhibiting group and generate an organic carboxylic acid under the action of the acid generated from the component (B). Accordingly, in those cases where the component (C) is prepared from a phenolic compound containing no carboxyl groups, by protecting the phenolic hydroxyl groups with the aforementioned dissolution inhibiting groups, at least one of the phenolic hydroxyl groups must use a carboxylic acid-generating group such as a tertiary alkyloxycarbonylalkyl group.

Furthermore, in those cases where the component (C) is prepared from a compound containing at least one carboxyl group, by protecting the carboxyl groups with the aforementioned dissolution inhibiting groups, any of the aforementioned dissolution inhibiting groups may be selected.

From the viewpoints of achieving a high level of resolution and a favorable resist pattern shape at low cost, particularly preferred examples of the component (C) include phenol derivatives (c-1) with a weight average molecular weight from 200 to 1,000, and preferably from 600 to 900, and copolymers (c-2) that contain at least 2 mol % of structural units derived from a (meth)acrylic acid containing an acid dissociable, dissolution inhibiting group, and have a weight average molecular weight within a range from 2,000 to 20,000.

As the component (c-1), phenol derivatives containing from 1 to 6, and preferably from 2 to 4 substituted or unsubstituted benzene rings are preferred.

The component (c-1) can be further classified into (i), (ii) and (iii) described below.

(i) Compounds prepared by subjecting a mixture of a phenolic compound such as bisphenol A or a trisphenol, and the tertiary alkyl ester of a halogenated fatty acid such as tert-butyl bromoacetate to a dehydrohalogenation reaction in the presence of an alkali catalyst, thus substituting the hydrogen atom of the phenolic hydroxyl group with a tertiary alkyloxycarbonylalkyl group. In those cases where the compound contains a plurality of hydroxyl groups, the other hydroxyl group hydrogen atoms may also be substituted with other acid dissociable, dissolution inhibiting groups, different from the tertiary alkyloxycarbonylalkyl group.

(ii) Compounds prepared by subjecting a carboxyl group-containing compound such as biphenyldicarboxylic acid, naphthalenedicarboxylic acid or benzophenonedicarboxylic acid to substitution with an acid dissociable, dissolution inhibiting group.

(iii) Compounds prepared by subjecting a compound containing both a carboxyl group and a hydroxyl group, such as 4,4'-bis(4-hydroxyphenyl)pentane to substitution of either the carboxyl group or the hydroxyl group with an acid dissociable, dissolution inhibiting group. In this case, the carbonyl group and the hydroxyl group may be substituted with different acid dissociable, dissolution inhibiting groups.

Many phenolic compounds classified within (i) above are already widely known as the phenolic compounds for use as photosensitive components within non-chemically amplified positive resists, and as sensitivity improvement agents for addition to such positive resists, and any of these known compounds can be used. Examples of such compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol.

As the carboxyl group-containing compound of (ii) above, any of the already known carboxylic acid compounds can be used. Examples include cyclohexanecarboxylic acid, benzoic acid, salicylic acid, biphenylpolycarboxylic acid, naphthalene(di)carboxylic acid, naphthalenetriacetic acid, benzoylbenzoic acid, anthracenecarboxylic acid, benzophenonedicarboxylic acid, 1-naphthylacetic acid, and the compound represented by the formula shown below.

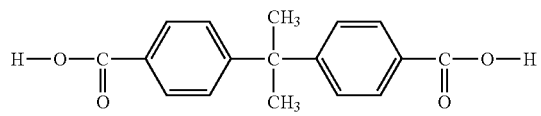

As the compound containing both a carboxyl group and a hydroxyl group of (iii) above, any of the already known compounds can be used. Examples include 2,2'-bis(4-hydroxyphenyl)propanoic acid and 4,4'-bis(4-hydroxyphenyl)pentanoic acid.

Particularly preferred forms of the compound (c-1) can be further classified into: (c-1-1) compounds represented by the general formula (i) shown below, wherein the hydrogen atom of at least one of the hydroxyl groups or carboxyl groups has been substituted with an acid dissociable, dissolution inhibiting group, and (c-1-2) condensation products of formaldehyde with at least one compound selected from amongst phenol, m-cresol, p-cresol and xylenol, wherein at least one of the hydrogen atoms of the hydroxyl groups has been substituted with a tert-butyloxycarbonylalkyl group.

These compounds (c-1-1) and (c-1-2) provide the positive resist composition with a high level of contrast, and enable further improvements in the resist pattern shape and the resolution, and are consequently preferred.

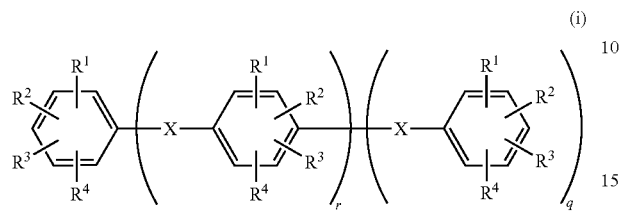

(i)

[wherein, $R^1$ to $R^4$ each represent, independently, a hydrogen atom, a straight chain, branched, or cyclic alkyl group of no more than 6 carbon atoms, lower alkoxy group, hydroxyl group, carboxyl group, or carboxyl group-containing alkyl group, although at least one of the groups $R^1$ to $R^4$ must be a hydroxyl group or carboxyl group, each X represents, independently, a single bond, —C(O)—, or —C($R^5$)($R^6$)—, $R^5$ represents a hydrogen atom or lower alkyl group, $R^6$ represents a hydrogen atom, lower alkyl group, carboxyl group, carboxyl group-containing alkyl group, or aryl group represented by a general formula (ii) shown below (wherein, the groups $R^1$ to $R^4$ within the formula (ii) are as defined above), r represents either 0 or an integer from 1 to 2, and q represents either 0 or 1, although in those cases where q is 0, the group inside the parentheses is a hydrogen atom]

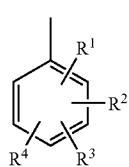

(ii)

In addition, compounds represented by the general formula (I) shown below, wherein the hydrogen atom of at least one of the hydroxyl groups or carboxyl groups has been substituted with an acid dissociable, dissolution inhibiting group are particularly preferred.

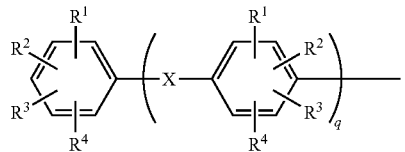

(I)

[wherein, $R^1$ to $R^4$, and X are as defined above]

Examples of suitable straight chain, branched, or cyclic alkyl groups of no more than 6 carbon atoms for the above groups $R^1$ to $R^6$ include methyl groups, ethyl groups, n-propyl groups, isopropyl groups, n-butyl groups, sec-butyl groups, tert-butyl groups, cyclopentyl groups, and cyclohexyl groups.

Examples of suitable lower alkoxy groups include alkoxy groups of 1 to 5 carbon atoms such as methoxy groups, ethoxy groups and propoxy groups.

Examples of suitable lower alkyl groups include alkyl groups of 1 to 5 carbon atoms such as methyl groups, ethyl groups, n-propyl groups, isopropyl groups, n-butyl groups, sec-butyl groups and tert-butyl groups. Suitable carboxyl group-containing alkyl groups include groups in which a carboxyl group is bonded to an alkylene group of 1 to 10 carbon atoms, and suitable examples of such alkylene groups include methylene groups, ethylene groups, and straight chain or branched propylene groups, butylene groups, hexylene groups, heptylene groups and nonylene groups.

Specific examples of the component (c-1) according to the present invention include the compounds shown below.

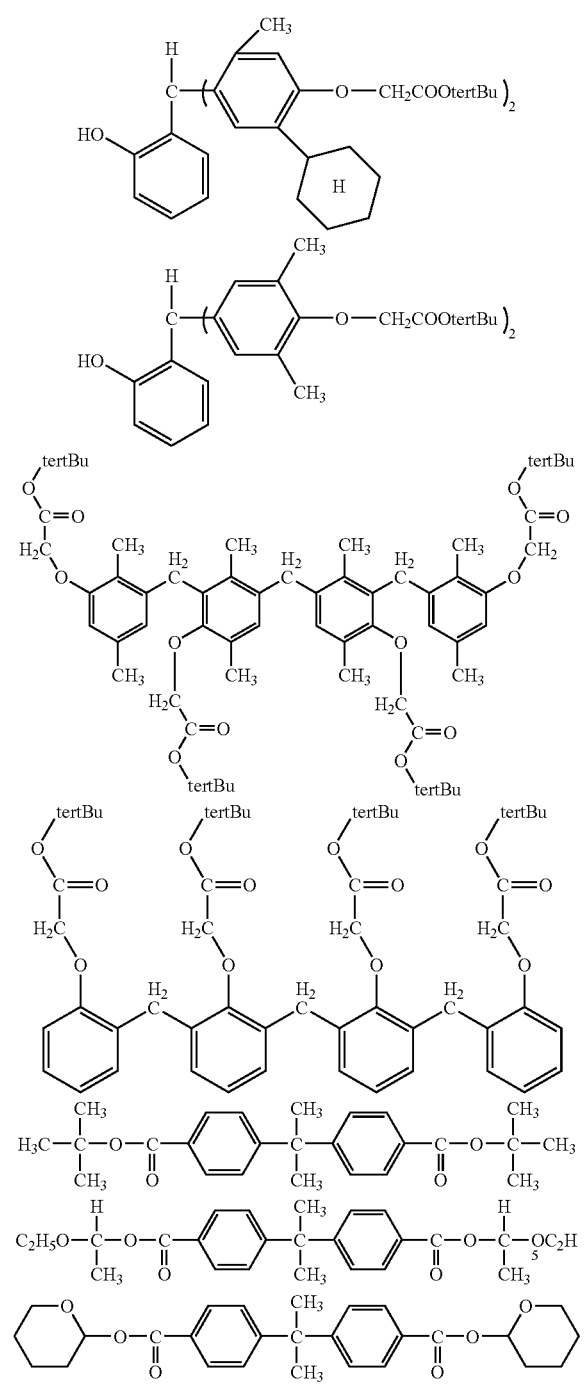

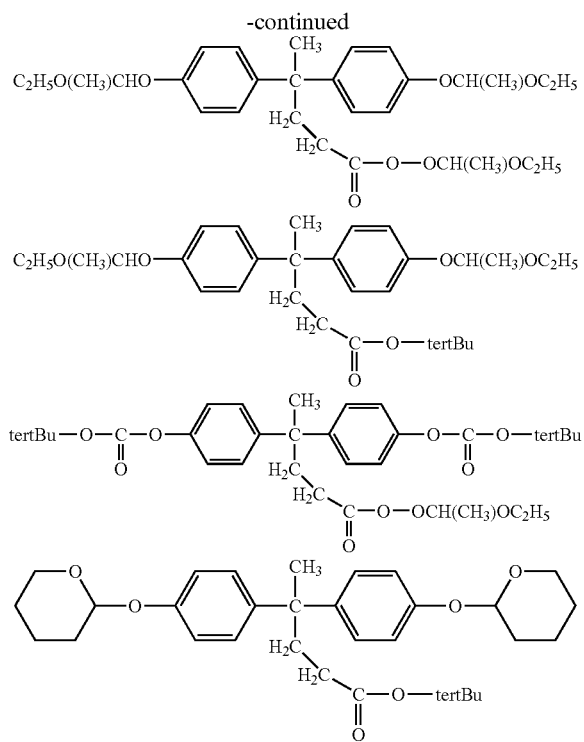

Furthermore, of the aforementioned (c-1-1) compounds, those represented by the formulas (1) and (2) shown below are preferred.

(1)

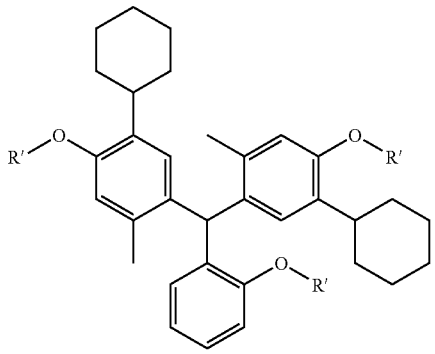

(wherein, R' represents an acid dissociable, dissolution inhibiting group)

(2)

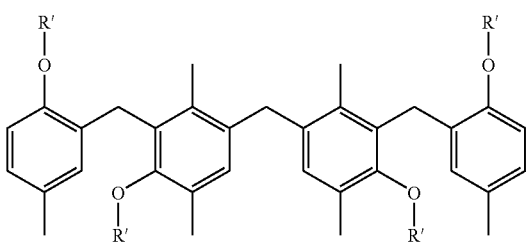

(wherein, R' represents an acid dissociable, dissolution inhibiting group)

In the general formulas (1) and (2) shown above, examples of the R' group include the acid dissociable, dissolution inhibiting groups described above, and at least one group selected from a group consisting of tertiary alkoxycarbonyl groups, tertiary alkoxycarbonylalkyl groups, tertiary alkyl groups, cyclic ether groups, alkoxyalkyl groups and 1-alkylcycloalkyl groups is preferred.

Furthermore, the acid dissociable, dissolution inhibiting group is preferably at least one group selected from a group consisting of a tert-butyloxycarbonyl group, tert-butyloxycarbonylmethyl group, tert-butyl group, tetrahydropyranyl group, ethoxyethyl group, 1-methylcyclohexyl group, and 1-ethylcyclohexyl group.

Furthermore, the acid dissociable, dissolution inhibiting group is even more preferably at least one group selected from a group consisting of a tert-butyloxycarbonylmethyl group, tert-butyl group, tetrahydropyranyl group, ethoxyethyl group, 1-methylcyclohexyl group, and 1-ethylcyclohexyl group.

Of these, tertiary alkoxycarbonylmethyl groups are preferred, and of such groups, a tert-butyloxycarbonylmethyl group is particularly desirable.

Of the compounds represented by the aforementioned general formulas (1) and (2), compounds represented by the general formula (1) are preferred, and of these, the compound in which all of the R' groups are tert-butyloxycarbonylmethyl groups is particularly desirable.

The blend proportion of the component (C) is typically within a range from 0.1 to 20 parts by weight, and preferably from 0.5 to 10 parts by weight, per 100 parts by weight of the component (A). By ensuring the proportion is at least as large as the lower limit of this range, a reduction in the level of developing defects is obtained. Ensuring a proportion no greater than the upper limit is advantageous in terms of contrast.

In those cases where a low molecular weight component (c-1) is used, the use of a quantity within a range from 0.5 to 10 parts by weight per 100 parts by weight of the component (A) yields a resist pattern with high resolution and excellent dry etching resistance, and is consequently preferred.

A positive resist composition of the present invention can be used for forming a resist pattern in the same manner as conventional KrF positive resist compositions.

The heating temperature used during prebaking and post exposure baking (PEB) is typically 90° C. or higher, and in order to form a resist pattern with favorable rectangularity, is preferably within a range from 90 to 120° C., and even more preferably from 90 to 110° C. Furthermore, using a temperature within this range means the occurrence of microbridges can also be effectively suppressed.

According to the embodiment 1 of the positive resist composition of the present invention, a resist pattern with excellent resolution and favorable rectangularity can be obtained.

Furthermore, by using the embodiment 1 of the positive resist composition of the present invention, the occurrence of developing defects such as microbridges can also be reduced.

The embodiment 2 of the positive resist composition of the present invention enables a reduction in the level of developing defects within the resist pattern, while retaining excellent resolution. As a result, characteristics other than the resolution, such as the cross-sectional shape of the resist pattern and the depth of focus can also be improved.

In addition, in the present invention, the protection ratio of the hydroxyl groups within the copolymer (A1) is lower than the protection ratio for hydroxyl groups within conventional PHS resins, meaning a satisfactory level of insolubility in alkali developing solutions can be obtained.

The effects of the present invention in improving the resolution performance and improving the rectangularity can be confirmed, for example, by inspection of the resist pattern obtained following developing treatment using a SEM (scanning electron microscope).

Furthermore, the effect of the present invention in suppressing developing defects can be confirmed, for example, by inspecting the resist pattern using either the aforementioned SEM or a developing defects inspection apparatus, and looking for the presence of microbridges and other defects.

Furthermore, a positive resist composition of the present invention can also be ideally employed within a method of forming a resist pattern that includes a thermal flow treatment described below, and yields a favorable flow rate. In particular, a positive resist composition of the present invention can be used for forming a favorable ultra fine resist pattern via a method of forming a resist pattern that includes a thermal flow treatment, even if the composition contains no cross-linking agent component (component (E)), which can have a deleterious effect on the storage stability of the resist composition. It is thought that the reason for this finding is that heating actually causes a cross-linking reaction between the structural units (a1) and the structural units (a2) of the copolymer (A1). If required, a component (E) may also be included.

Furthermore, as described above, the developing step prior to the thermal flow treatment enables the formation of a resist pattern which exhibits high levels of resolution and rectangularity, and in which developing defects have been prevented, meaning that the narrowed resist pattern obtained by conducting subsequent thermal flow treatment also exhibits a high level of resolution performance, excellent rectangularity, and a reduced level of developing defects.

<<Method of Forming Resist Pattern>>

Next is a description of a method of forming a resist pattern according to the present invention.

First, an aforementioned positive resist composition of the present invention is applied to the surface of a substrate such as a silicon wafer using a spinner or the like, and a prebake is then conducted. The coating of the positive resist composition is then selectively exposed with an exposure apparatus through a desired mask pattern, and PEB (post exposure baking) is then conducted. Subsequently, a developing treatment is performed using an alkali developing solution, a rinse treatment is then conducted to wash away any developing solution left on the surface of the substrate, together with those sections of the resist composition that have dissolved in the developing solution, and the substrate is then dried.

The steps up until this point can be conducted using conventional techniques. The operating conditions and the like can be set appropriately in accordance with the makeup and characteristics of the positive resist composition that is used.

The exposure is preferably conducted using a KrF excimer laser, although compositions of the present invention can also be used with electron beam resists and EUV (extreme ultraviolet light).

An organic or inorganic anti-reflective film may also be provided between the substrate and the coating of the resist composition.

<Thermal Flow Treatment>

In a method of forming a resist pattern according to the present invention, the resist pattern that has been formed in the manner described above is preferably subjected to thermal flow treatment, thereby narrowing the resist pattern. As follows is a description of this thermal flow treatment.

Thermal flow treatment is conducted by heating the resist pattern at least once. Increasing the number of heating repetitions enables the degree of variation in the resist pattern size per unit of temperature (hereafter referred to as the flow rate) to be reduced, and is consequently preferred. However, the number of steps increases, and the time required for the treatment increases, which causes a lowering of the throughput.

Lower flow rates in the thermal flow treatment produce a higher level of in-plane uniformity for the pattern dimensions of the narrowed resist pattern formed on the wafer, and the cross-sectional shape of the narrowed resist pattern is also superior. If the resist film thickness is 1,000 nm or less, then the film thickness has almost no effect on the flow rate.

The heating temperature used in the thermal flow treatment is selected in accordance with the composition of the resist pattern, and is typically selected within a range from 100 to 200° C., and preferably from 110 to 180° C. In those cases where two or more heating repetitions are conducted, the second and any subsequent heating repetitions are conducted at either the same temperature as, or a higher temperature than, the first heating repetition.

There are no particular restrictions on the heating time, provided it does not hinder throughput and yields the desired resist pattern size, although each heating repetition is preferably conducted for a time within a range from 30 to 270 seconds, with times within a range from 60 to 120 seconds being even more desirable.

A method of forming a resist pattern that includes a thermal flow treatment can be used favorably in the formation of the types of ultra fine resist hole patterns that are difficult to form using normal methods.

A method of forming a resist pattern according to the present invention is conducted using a positive resist composition of the present invention, and consequently, a favorable flow rate can be obtained both for compositions that contain no cross-linking agent, and for compositions that also contain an aforementioned cross-linking agent component (E). Accordingly, a narrowed resist pattern can be obtained which exhibits a high level of resolution, favorable rectangularity for the resist pattern, minimal developing defects, and a high degree of in-plane uniformity for the pattern dimensions.

EXAMPLES

As follows is a more detailed description of the present invention, using a series of examples.

Example 1

First, the component (A) was prepared. Namely, a copolymer formed from p-hydroxystyrene and the adamantanol methacrylate of the above general formula (IIa) in which R is a methyl group (molar ratio: 80:20, weight average molecular weight (Mw): 8,000, polydispersity (Mw/Mn): 1.78), and ethyl vinyl ether were reacted together using normal methods in the presence of an acid catalyst, thus forming a resin X (Mw=10,000, Mw/Mn=1.7) in which some of the hydroxyl groups of the copolymer had been protected with 1-ethoxyethyl groups, and this resin was used as the component (A).

When this resin X was analyzed by $^1$H-NMR, the number of 1-ethoxyethoxy groups relative to the total number of hydroxyl groups within the p-hydroxystyrene and adamantanol was 18%. This indicates a protection ratio for the hydroxyl groups of 18 mol %.

100 parts by weight of this component (A), 5.0 parts by weight of bis(cyclohexylsulfonyl)diazomethane, 6.0 parts by weight of bis(isopropylsulfonyl)diazomethane, and 2.0 parts by weight of triphenylsulfonium trifluoromethanesulfonate as the component (B), and 0.15 parts by weight of triethanolamine and 0.15 parts by weight of triisopropylamine as the component (D) were dissolved in 500 parts by weight of a mixed solvent of PGMEA and EL (with a weight ratio PGMEA:EL of 6:4), thus yielding a positive resist composition.

Meanwhile, a substrate was prepared by layering an organic anti-reflective film (brand name DUV-44, manufactured by Brewer Science Ltd.) on top of an 8 inch silicon wafer, and then heating at 205° C. to form a film of thickness 65 nm.

The positive resist composition obtained above was applied to the surface of this substrate using a spinner, and was then prebaked and dried on a hotplate at 100° C. for 90 seconds, thereby forming a resist layer with a film thickness of 410 nm.

This layer was then selectively irradiated with a KrF excimer laser (248 nm), through a typical chrome reticle, which is a mask used in reduced projection exposure, using a KrF scanner (wavelength λ: 248 nm) S203B (manufactured by Nikon Corporation, NA (numerical aperture)=0.68, 2/3 annular illumination).

Subsequently, the irradiated resist was subjected to PEB treatment at 110° C. for 60 seconds, was then subjected to puddle development for 60 seconds at 23° C. in a 2.38% by weight aqueous solution of tetramethylammonium hydroxide, and was then rinsed by washing with pure water for 15 seconds. The resist was then shaken dry, and then further dried by heating at 100° C. for 60 seconds, thus forming a resist pattern.

In this manner, a resist hole pattern with a hole diameter of 140 nm was formed. Furthermore, inspection of the substrate and the thus formed resist pattern using a scanning electron microscope (measuring SEM, S-9200) manufactured by Hitachi Ltd. revealed that the cross-sectional shape of the resist pattern was very favorable, with a high degree of rectangularity.

Furthermore, inspection of the substrate using a surface defect inspection apparatus KLA2132, manufactured by KLA Tencor Corporation, revealed only a very small number of surface defects of no more than 10, indicating an effective suppression of developing defects.

Measurement of the pure water contact angle (the stationary contact angle, this also applies below) of the unexposed portions revealed a value of 59 degrees, indicating favorable hydrophilicity.

The depth of focus of the 140 nm resist hole pattern was 0.6 μm.

Furthermore, inspection of a 1:1 line and space resist pattern formed in a similar manner revealed that excellent resolution was achieved even at a line width of 120 nm.

Example 2

With the exceptions of using 4.0 parts by weight of bis(cyclohexylsulfonyl)diazomethane, 1.0 parts by weight of bis(2,4-dimethylphenylsulfonyl)diazomethane and 4.0 parts by weight of triphenylsulfonium nonafluorobutanesulfonate as the component (B), using 0.3 parts by weight of triethanolamine and 0.3 parts by weight of triisopropanolamine as the component (D), and also adding 2 parts by weight of a dissolution inhibitor represented by a formula (VI) shown below, a positive resist composition was obtained in the same manner as the example 1.

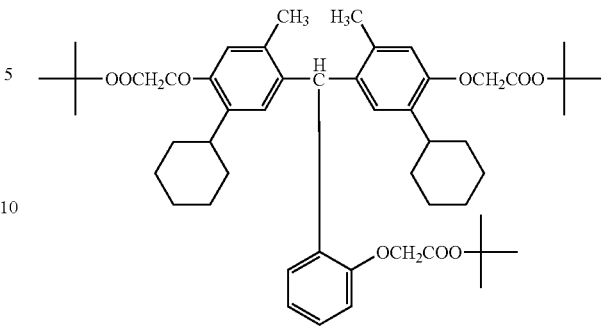

Meanwhile, a substrate was prepared by layering an organic anti-reflective film (brand name DUV-44, manufactured by Brewer Science Ltd.) on top of an 8 inch silicon wafer, and then heating at 225° C. for 60 seconds to form a film of thickness 65 nm.

The positive resist composition obtained above was applied to the surface of this substrate using a spinner, and was then prebaked and dried on a hotplate at 100° C. for 60 seconds, thereby forming a resist layer with a film thickness of 287 nm.

This layer was then selectively irradiated with a KrF excimer laser (248 nm), through a 8% halftone reticle using a KrF scanner (wavelength λ: 248 nm) NSR-S203B (manufactured by Nikon Corporation, NA (numerical aperture)=0.68, 2/3 annular illumination).

Subsequently, the irradiated resist was subjected to post exposure baking (PEB) treatment at 110° C. for 60 seconds, was then subjected to puddle development for 60 seconds at 23° C. in a 2.38% by weight aqueous solution of tetramethylammonium hydroxide, and was then rinsed by washing with pure water for 15 seconds, shaken dry, and then further dried by heating at 100° C. for 60 seconds, thus forming a resist pattern.

Confirmation of the properties of the resist using a scanning electron microscope (measuring SEM, S-9200) manufactured by Hitachi Ltd. showed that a line and space pattern with a pattern size of 120 nm had been formed, the shape of the pattern exhibited a high degree of rectangularity, and the depth of focus was 0.3 μm. Furthermore, measurement of the level of developing defects revealed a result of 5 defects or less.

Reference Example 1

With the exception of using 5.0 parts by weight of bis(cyclohexylsulfonyl)diazomethane as the component (B), a positive resist composition was prepared in the same manner as the example 2, and a resist pattern was then formed using this positive resist composition.

As a result, a line and space pattern with a pattern size of 130 nm was formed, but the rectangularity of the pattern was poor, with the top portions of the pattern a rounded shape.

This reference example 1 corresponds with an example of the second aspect, and is provided here for the purposes of comparison with the examples 1 and 2.

Reference Example 2

With the exception of using 5.0 parts by weight of triphenylsulfonium nonafluorobutanesulfonate as the component (B), a positive resist composition was prepared in the same manner as the example 2, and a resist pattern was then formed using this positive resist composition.

As a result, a line and space pattern with a pattern size of 150 nm was formed, but the rectangularity of the pattern was poor, with the pattern formed with a T-top shape.

This reference example 2 corresponds with an example of the second aspect, and is provided here for the purposes of comparison with the examples 1 and 2.

Example 3

A positive resist composition was prepared in the same manner as the example 1.

The same positive resist composition as that used in the example 1 was applied, using a spinner, to the surface of the same type of organic anti-reflective film-coated substrate as that used in the example 1, and the composition was then prebaked and dried on a hotplate at 100° C. for 90 seconds, thereby forming a resist layer with a film thickness of 410 nm.

This layer was then selectively irradiated with a KrF excimer laser (248 nm), through a 6% half tone reticle (a hole pattern with a hole diameter of 150 nm) using the same KrF scanner as that used in the example 1.

Subsequently, the irradiated resist was subjected to PEB treatment at 110° C. for 90 seconds, and was then subjected sequentially to developing, water rinsing, and drying in the same manner as the example 1, thus forming a resist pattern.

In this manner, a resist hole pattern with a hole diameter of 150 nm was formed. Inspection of the substrate on which the resist pattern had been formed in the same manner as the example 1 revealed a resist pattern shape with a high degree of rectangularity. Furthermore, the number of surface defects was only a very small number of no more than 10. In addition, the depth of focus of the resist hole pattern with a hole diameter of 150 nm was 0.6 µm.

Measurement of the hole diameter of the resist hole pattern was conducted using a measuring SEM.

Subsequently, thermal flow treatment was performed on the substrate on which the resist hole pattern had been formed, by heating the substrate on a hotplate under predetermined conditions, thus producing a narrowed resist hole pattern.

The flow rate was determined by altering the heating conditions used in the thermal flow treatment, while measuring the dimensions of the resulting resist hole pattern, and thus determining the flow rate. In other words, five of the above substrates with a resist hole pattern of diameter 150 nm formed thereon were prepared in the manner described above, and these substrates were heated for 90 seconds at 140° C., 145° C., 150° C., 155° C., and 160° C. respectively.

At each temperature, the heating caused a narrowing of the hole diameter of the resist hole pattern, yielding a narrowed resist hole pattern of favorable shape, although the hole diameter following narrowing varied depending on the heating temperature used. A graph was prepared showing temperature along the horizontal axis, and the degree of dimensional variation in the resist pattern (the variation in the hole diameter) at each temperature along the vertical axis, and this graph was used to determine the resist pattern dimensional variation per unit of temperature variation (° C.), namely the flow rate, at the point where the resist pattern dimension (the hole diameter) following narrowing was 100 nm.

The resist pattern dimensions (hole diameters) following narrowing were 147 nm at 140° C., 140 nm at 145° C., 128 nm at 150° C., 100 nm at 155° C., and 80 nm at 160° C., and the flow rate required for a narrowed hole diameter of 100 nm was 4.8 nm/° C.

As is evident from these results, the examples 1 to 3 that used positive resist compositions according to the first aspect of the present invention yielded resist patterns with excellent resolution and favorable rectangularity.

Furthermore, in the example 3, where a positive resist composition of the present invention was used within a method of forming a resist pattern that included a thermal flow treatment, a favorable flow rate was obtained.

Example 4

First, the component (A) was prepared. Namely, a copolymer formed from p-hydroxystyrene and the adamantanol methacrylate of the above general formula (IIa) in which R is a methyl group (molar ratio: 80:20, weight average molecular weight (Mw): 8,000, polydispersity (Mw/Mn): 1.78), and ethyl vinyl ether were reacted together using normal methods in the presence of an acid catalyst, thus forming a resin X (Mw=10,000, Mw/Mn=approximately 1.7) in which some of the hydroxyl groups of the copolymer had been protected with 1-ethoxyethyl groups, and this resin was used as the component (A).

When this resin X was analyzed by $^{1}$H-NMR, the number of 1-ethoxyethoxy groups relative to the total number of hydroxyl groups within the p-hydroxystyrene and adamantanol was 20%. This indicates a protection ratio for the hydroxyl groups of 20 mol %.

100 parts by weight of this component (A), 4.0 parts by weight of bis(cyclohexylsulfonyl)diazomethane, 1.0 parts by weight of bis(2,4-dimethylphenylsulfonyl)diazomethane and 4.0 parts by weight of triphenylsulfonium nonafluorobutane-sulfonate as the component (B), 2 parts by weight of a component (C) represented by the chemical formula shown below,

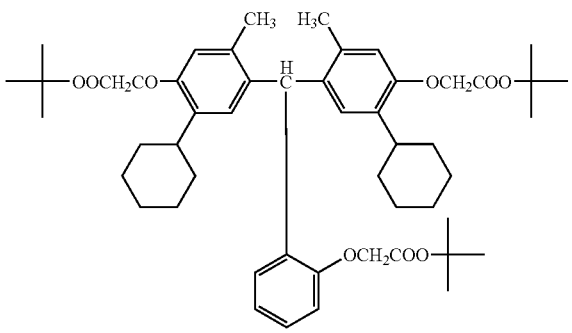

and 0.3 parts by weight of triethanolamine and 0.3 parts by weight of triisopropanolamine as the component (D) were dissolved in 500 parts by weight of a mixed solvent of PGMEA and EL (with a weight ratio PGMEA:EL of 6:4), thus yielding a positive resist composition.

Meanwhile, a substrate was prepared by applying an organic anti-reflective film material (brand name DUV-44, manufactured by Brewer Science Ltd.) to the surface of an 8 inch silicon wafer, and then heating at 225° C. for 60 seconds, thereby forming a substrate with an anti-reflective film with a film thickness of 65 nm formed thereon.

The positive resist composition obtained above was applied to the surface of the anti-reflective film on top of the substrate using a spinner, and was then prebaked and dried on a hotplate at 100° C. for 60 seconds, thereby forming a resist layer with a film thickness of 287 nm.

This resist layer was then selectively irradiated with a KrF excimer laser (248 nm), through a 8% half tone reticle using a KrF scanner (wavelength λ: 248 nm) NSR-S203B (manufactured by Nikon Corporation, NA (numerical aperture)= 0.68, 2/3 annular illumination).

Subsequently, the resulting resist layer was subjected to PEB treatment at 110° C. for 60 seconds, was then subjected to puddle development for 60 seconds at 23° C. in a 2.38% by weight aqueous solution of tetramethylammonium hydroxide, and was then rinsed by washing with pure water for 15 seconds. The resist was then shaken dry, and then further dried by heating at 100° C. for 60 seconds, thus forming a resist pattern.

Inspection of the substrate and the thus formed resist pattern using a scanning electron microscope (measuring SEM, S-9200) manufactured by Hitachi Ltd. showed that a 120 nm line and space pattern had been resolved. Furthermore, there were no developing defects such as developing residues.

Reference Example 3

When an experiment was conducted in the same manner as the example 4, but with the exception of not adding the component (C), and the resulting pattern was evaluated, a 130 nm line and space pattern was resolved. However, developing residues existed within the resist pattern, with fine uneven developing defects noticeable, particularly at the interfaces between the lines and spaces.

This reference example 3 corresponds with an example of the first aspect, and is provided here for the purposes of comparison with the example 4.

From the results of the aforementioned example 4 and reference example 3 it is clear that by adding the component (C), the occurrence of developing defects such as developing residues can be effectively suppressed.

The invention claimed is:

1. A positive resist composition, comprising a resin component (A), which contains acid dissociable, dissolution inhibiting groups and exhibits increased alkali solubility under action of acid, and an acid generator component (B) that generates acid on exposure, wherein said resin component (A) is a copolymer (A1) comprising a first structural unit (a1) derived from hydroxystyrene and a second structural unit (a2) derived from a (meth)acrylate ester having an alcoholic hydroxyl group, in which a portion of hydroxyl groups of said structural units (a1) and alcoholic hydroxyl groups of said structural units (a2) have been protected with said acid dissociable, dissolution inhibiting groups, and said composition further comprises a component (C), which contains at least one acid dissociable, dissolution inhibiting group, and which under action of acid generated from said component (B), undergoes dissociation of said dissolution inhibiting group, generating an organic carboxylic acid.

2. A positive resist composition according to claim 1, wherein said component (C) is a phenol derivative containing from 1 to 6 substituted or unsubstituted benzene rings, with a weight average molecular weight within a range from 200 to 1,000.

3. A positive resist composition according to claim 2, wherein said component (C) is a compound represented by a general formula (1) shown below:

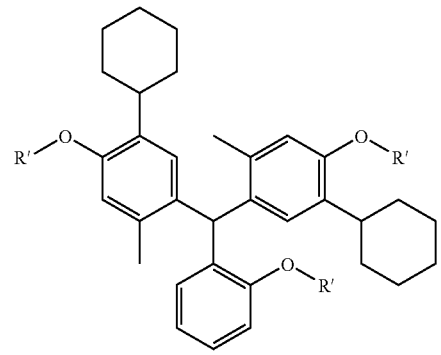

(1)

(wherein, R' represents an acid dissociable, dissolution inhibiting group).

4. A positive resist composition according to claim 3, wherein within said general formula (1), R' represents a tert-butyloxycarbonylmethyl group.

5. A positive resist composition according to claim 1, wherein at least 10 mol % but no more than 25 mol % of a combination of said hydroxyl groups of said structural units (a1) and said alcoholic hydroxyl groups of said structural units (a2) are protected with said acid dissociable, dissolution inhibiting groups, and a weight average molecular weight of said copolymer (A1) prior to protection with said acid dissociable, dissolution inhibiting groups is at least 2,000 but no more than 8,500.

6. A positive resist composition according to claim 1, wherein in said copolymer (A1), a molar ratio between said structural units (a1) and said structural units (a2) prior to protection with said acid dissociable, dissolution inhibiting groups is within a range from 85:15 to 70:30.

7. A positive resist composition according to claim 1, wherein said structural unit (a2) is a structural unit derived from a (meth)acrylate ester containing an aliphatic polycyclic group having an alcoholic hydroxyl group.

8. A positive resist composition according to claim 7, wherein said structural unit (a2) is a structural unit derived from a (meth)acrylate ester containing an adamantyl group having an alcoholic hydroxyl group.

9. A positive resist composition according to claim 1, wherein said acid dissociable, dissolution inhibiting groups are 1-lower alkoxyalkyl groups.

10. A positive resist composition according to claim 1, wherein a polydispersity (Mw/Mn ratio) of said copolymer (A1) prior to protection with said acid dissociable, dissolution inhibiting groups is no greater than 2.0.

11. A positive resist composition according to claim 1, further comprising a nitrogen-containing organic compound (D).

12. A method of forming a resist pattern, comprising the steps of forming a positive resist film on top of a substrate using a positive resist composition according to claim 1, conducting a selective exposure treatment of said positive resist film, and performing a developing treatment to form said resist pattern.

13. A method of forming a resist pattern according to claim 12, wherein said resist pattern formed by performing a developing treatment is subjected to a thermal flow treatment, thereby narrowing said resist pattern.

* * * * *

UNITED STATES PATENT AND TRADEMARK OFFICE
CERTIFICATE OF CORRECTION

PATENT NO. : 7,629,105 B2 Page 1 of 1
APPLICATION NO. : 10/566425
DATED : December 8, 2009
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 705 days.

Signed and Sealed this

Twenty-first Day of December, 2010

David J. Kappos
*Director of the United States Patent and Trademark Office*